US007753667B2

(12) United States Patent
Koga et al.

(10) Patent No.: US 7,753,667 B2
(45) Date of Patent: Jul. 13, 2010

(54) RESIN-SEALED MOLD AND RESIN-SEALED DEVICE

(75) Inventors: Noriaki Koga, Kagoshima (JP);
Tadaaki Ikeda, Kagoshima (JP); Koki Fujiwara, Tokyo (JP); Takuro Endo, Tokyo (JP)

(73) Assignee: Panasonic Corporation, Osaka (JP)

( * ) Notice: Subject to any disclaimer, the term of this patent is extended or adjusted under 35 U.S.C. 154(b) by 573 days.

(21) Appl. No.: 11/719,009

(22) PCT Filed: Nov. 10, 2005

(86) PCT No.: PCT/JP2005/020592

§ 371 (c)(1),
(2), (4) Date: May 10, 2007

(87) PCT Pub. No.: WO2006/051844

PCT Pub. Date: May 18, 2006

(65) Prior Publication Data

US 2007/0281050 A1 Dec. 6, 2007

(30) Foreign Application Priority Data

Nov. 12, 2004 (JP) ............................. 2004-329276

(51) Int. Cl.
*B29C 45/14* (2006.01)

(52) U.S. Cl. ........................ 425/116; 425/125; 425/441; 425/442

(58) Field of Classification Search ................. 425/116, 425/125, 129.1, 441, 442, 544, DIG. 58
See application file for complete search history.

(56) References Cited

U.S. PATENT DOCUMENTS

| 3,454,693 | A | * | 7/1969 | Crenshaw ................... 264/151 |
| 3,467,986 | A | * | 9/1969 | Canty et al. ................. 425/117 |
| 3,824,053 | A | * | 7/1974 | Styrkowicz ................. 425/123 |
| 4,172,577 | A | * | 10/1979 | Von Holdt ................... 249/58 |
| 4,209,160 | A | * | 6/1980 | Vanotti ....................... 249/162 |
| 4,954,308 | A | * | 9/1990 | Yabe et al. ............. 264/272.17 |
| 5,310,330 | A | * | 5/1994 | Zweig et al. ................ 425/116 |
| 5,509,794 | A | * | 4/1996 | Nakamura et al. ............ 425/3 |
| 5,558,883 | A | * | 9/1996 | Shinada et al. ............. 425/116 |
| 5,714,174 | A | * | 2/1998 | Kashiyama ................. 425/116 |
| 2001/0013424 | A1 | | 8/2001 | Takase et al. |

FOREIGN PATENT DOCUMENTS

JP 64-20323 U 2/1989

(Continued)

*Primary Examiner*—Robert B Davis
(74) *Attorney, Agent, or Firm*—Hamre, Schumann, Mueller & Larson, P.C.

(57) ABSTRACT

A resin-sealing mold for sealing a semiconductor element with resin includes an upper die (12), a lower die (14) disposed so as to be opposed to the upper die (12), and a plurality of middle dies (13a, 13b) sandwiched between the upper die (12) and the lower die (14), wherein the plurality of middle dies (13a, 13b) are provided with molding faces at tip ends and are placed so that the molding faces are opposed to each other during the sealing. Because of this, the middle dies (13a, 13b) can be opened to the right and left from dividing faces I, and even a resin package of a semiconductor device with a concave part formed in a side surface can be molded.

1 Claim, 7 Drawing Sheets

FOREIGN PATENT DOCUMENTS

| | | | |
|---|---|---|---|
| JP | 64020323 U | * | 2/1989 |
| JP | 5-192948 | | 8/1993 |
| JP | 2001-223230 | | 8/2001 |
| JP | 2003-11187 | | 1/2003 |
| JP | 2004098364 A | * | 4/2004 |
| JP | 2004153045 A | * | 5/2004 |

* cited by examiner

RESIN-SEALED MOLD AND RESIN-SEALED DEVICE

TECHNICAL FIELD

The present invention relates to a resin-sealing mold and a resin-sealing apparatus for molding a semiconductor device, and in particular, to a technique of molding a resin package with a concave part formed in a side surface.

BACKGROUND ART

Conventionally, as one of the molding methods for sealing a semiconductor element with resin to form a semiconductor device, a transfer molding method is used. For the transfer molding method, a resin-sealing apparatus using a resin-sealing mold composed of an upper die and a lower die is used. According to this molding method, a lead frame of a semiconductor element is clamped with the upper die and the lower die, and resin is melted in a pot and fed to a cavity of the mold under pressure to be cured. After that, the upper die or the lower die is moved in a vertical direction to open the mold, whereby a semiconductor device that is a molded product is taken out.

Figure 7:
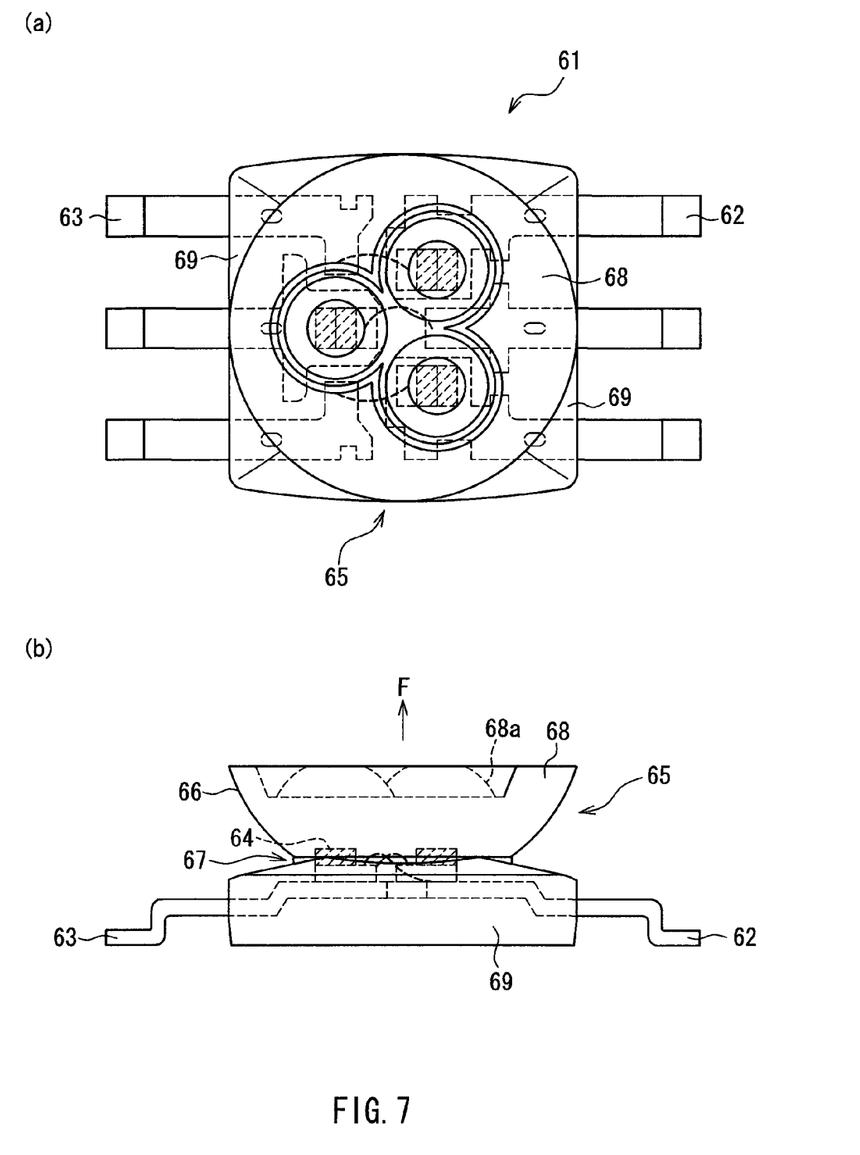
FIG. 7 is a view showing a surface-mounting type light-emitting diode: (a) is a plan view; and (b) is a side view.

As one example of the semiconductor device, there is a surface-mounting type light-emitting device in which a lens is formed with a resin package sealing a semiconductor light-emitting element. FIG. 7 shows an example of a surface-mounting type light-emitting diode. FIG. 7(a) is a plan view, and FIG. 7(b) is a side view.

In a light-emitting diode 61, semiconductor light-emitting elements 64 mounted on lead frames 62, 63 are covered with a translucent resin package 65. In the resin package 65, there are provided a lens part 68 condensing light output from the semiconductor elements 64, and a leg part 69 covering the lead frames 62, 62 and the semiconductor light-emitting elements 64 in an integrated manner. An outer circumference of the lens part 68 is provided with a curved surface 66. Since the curved surface 66 is present, a reduced-diameter part 67 is formed in a connecting portion between the lens part 68 and the leg part 69.

Thus, by providing the reduced-diameter part 67 to be a concave part in a side surface of the light-emitting diode 61, light output sideways from the semiconductor light-emitting elements 64 can be reflected totally from the curved surface 66 without waste, and can be condensed in a main light extraction direction F, so that the brightness can be enhanced.

However, in the case of molding the resin package 65 as shown in FIG. 7, due to the presence of the reduced-diameter part 67, the resin-sealing mold composed of the upper die and the lower die cannot be opened, so that a product cannot be molded.

Herein, Patent Document 1 proposes, as the resin-sealing mold, a resin-sealing apparatus provided with a middle die in addition to the upper die and the lower die. In this resin-sealing apparatus, the middle die is provided between the upper die and the lower die, a cavity is filled with resin from a pot via the middle die to seal the cavity with the resin, the lower die is lowered first, and then, the middle die is separated from the upper die to open the mold, whereby a molded product is taken out.

Although the resin-sealing apparatus described in Patent Document 1 has the middle die, the middle die merely plays a role as a gate for filling the cavity with resin. Therefore, even when an attempt is made to mold the resin package 65 with the reduced-diameter part 67 as shown in FIG. 7, the mold cannot be opened.

Patent Document 1: JP 2003-11187 A

DISCLOSURE OF INVENTION

The present invention solves the conventional problems as described above, and its object is to provide a resin-sealing mold and a resin-sealing apparatus capable of molding a resin package of a semiconductor device with a concave part formed in a side surface.

In order to achieve the above-mentioned object, a resin-sealing mold of the present invention for sealing a semiconductor element with resin includes an upper die, a lower die disposed so as to be opposed to the upper die, and a plurality of middle dies sandwiched between the upper die and the lower die, wherein the plurality of middle dies are provided with molding faces at tip ends and are placed so that the molding faces are opposed to each other during the sealing.

A resin-sealing apparatus of the present invention including a resin-sealing mold for sealing a semiconductor element with resin further includes an ejector pin and a lifter for raising/lowering the ejector pin, wherein the resin-sealing mold includes an upper die, a lower die disposed so as to be opposed to the upper die, and a plurality of middle dies sandwiched between the upper die and the lower die. The plurality of middle dies are provided with molding faces at tip ends and placed so that the molding faces are opposed to each other during the sealing. The plurality of middle dies have rotation shafts so that the molding faces rotate in an arc shape, and when the ejector pin is moved so as to push the middle die with the lifter, the plurality of middle dies rotate so that the opposed molding faces are opened with respect to the rotation shafts.

DESCRIPTION OF THE INVENTION

According to a resin-sealing mold of the present invention, a plurality of middle dies are provided and disposed so that molding faces are opposed to each other. Therefore, even a resin package of a semiconductor device with a concave part formed in a side surface can be molded.

Furthermore, according to a resin-sealing apparatus of the present invention, a plurality of middle dies are provided and disposed so that molding faces are opposed to each other. Therefore, a resin package of a semiconductor device with a concave part formed in a side surface can be molded. Furthermore, since the plurality of middle dies rotate so that the opposed molding faces are opened, a molded product can be taken out easily.

In the resin-sealing mold of the present invention, it is preferable that at least one of the molding faces is provided with a convex part for forming a concave part in a side surface of the resin after being molded.

Furthermore, it is preferable that the plurality of middle dies are provided with rotation shafts so that the molding faces rotate in an arc shape. According to this configuration, since the plurality of middle dies can rotate so that the opposed molding faces are opened, a molded product can be taken out easily.

Hereinafter, the present invention will be described by way of one embodiment with reference to the drawings.

Embodiment 1

Figure 1:
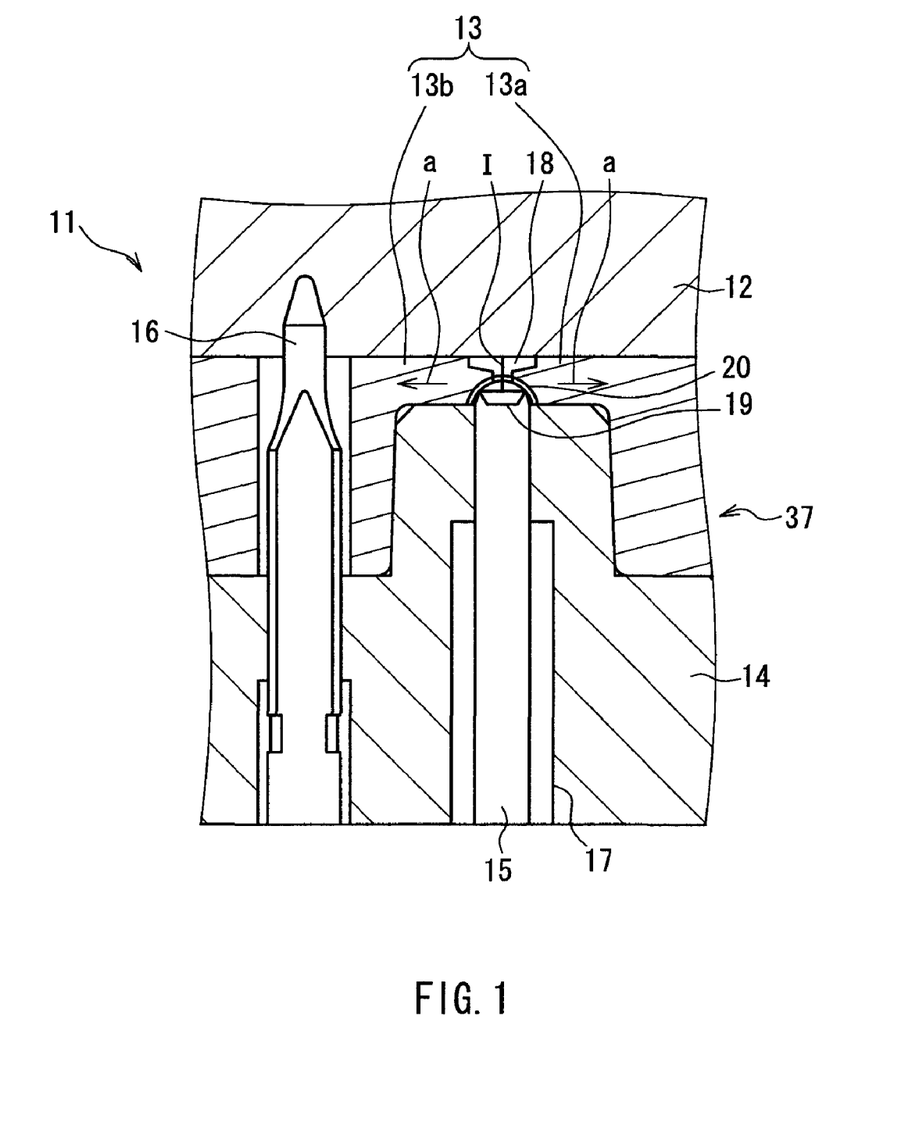
FIG. 1 is a cross-sectional view showing a configuration of a resin-sealing mold according to Embodiment 1 of the present invention.
Figure 2:
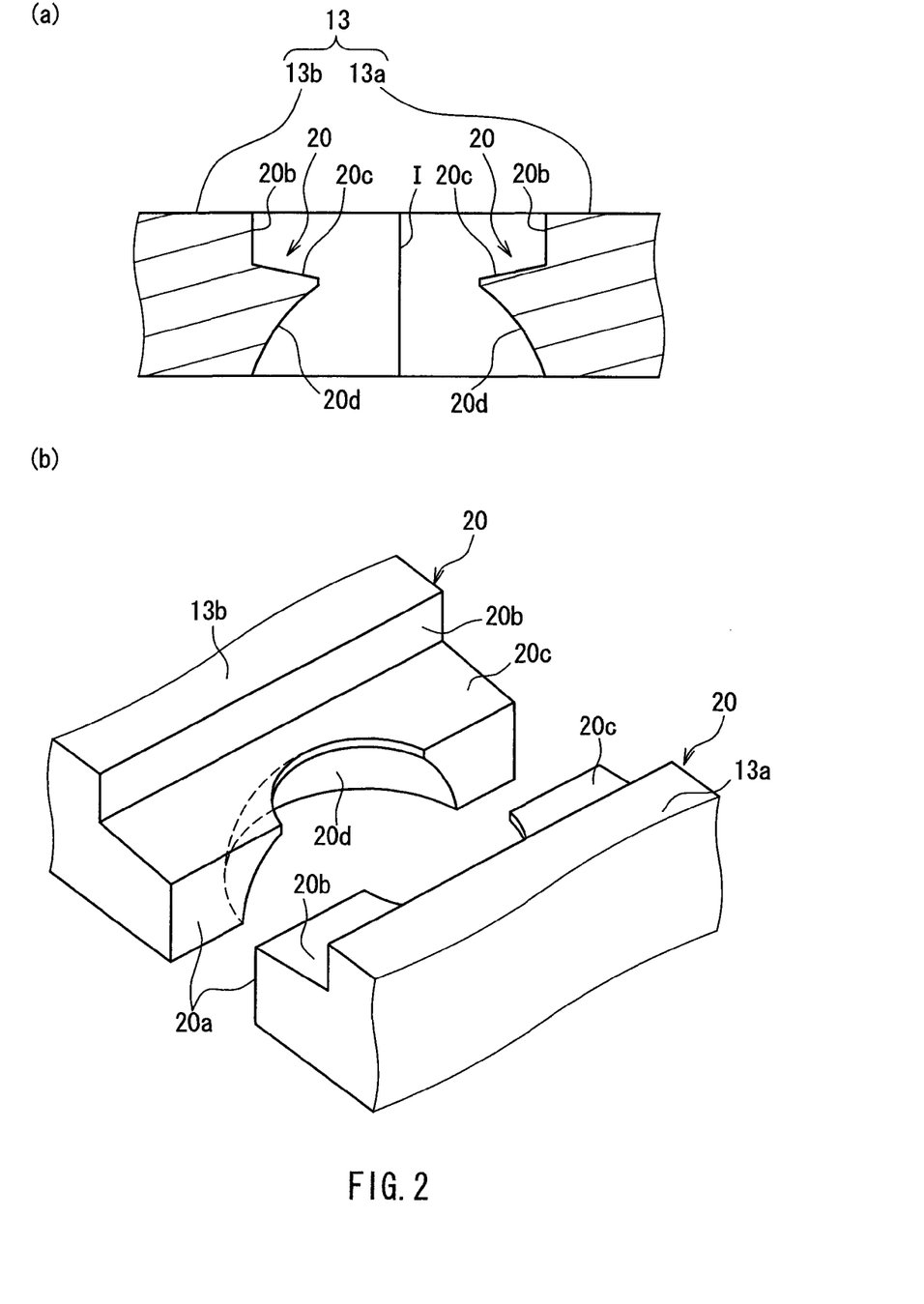
FIG. 2 is a partially enlarged view of a convex part of a middle die: (a) is a cross-sectional view; and (b) is a perspective view.
Figure 3:
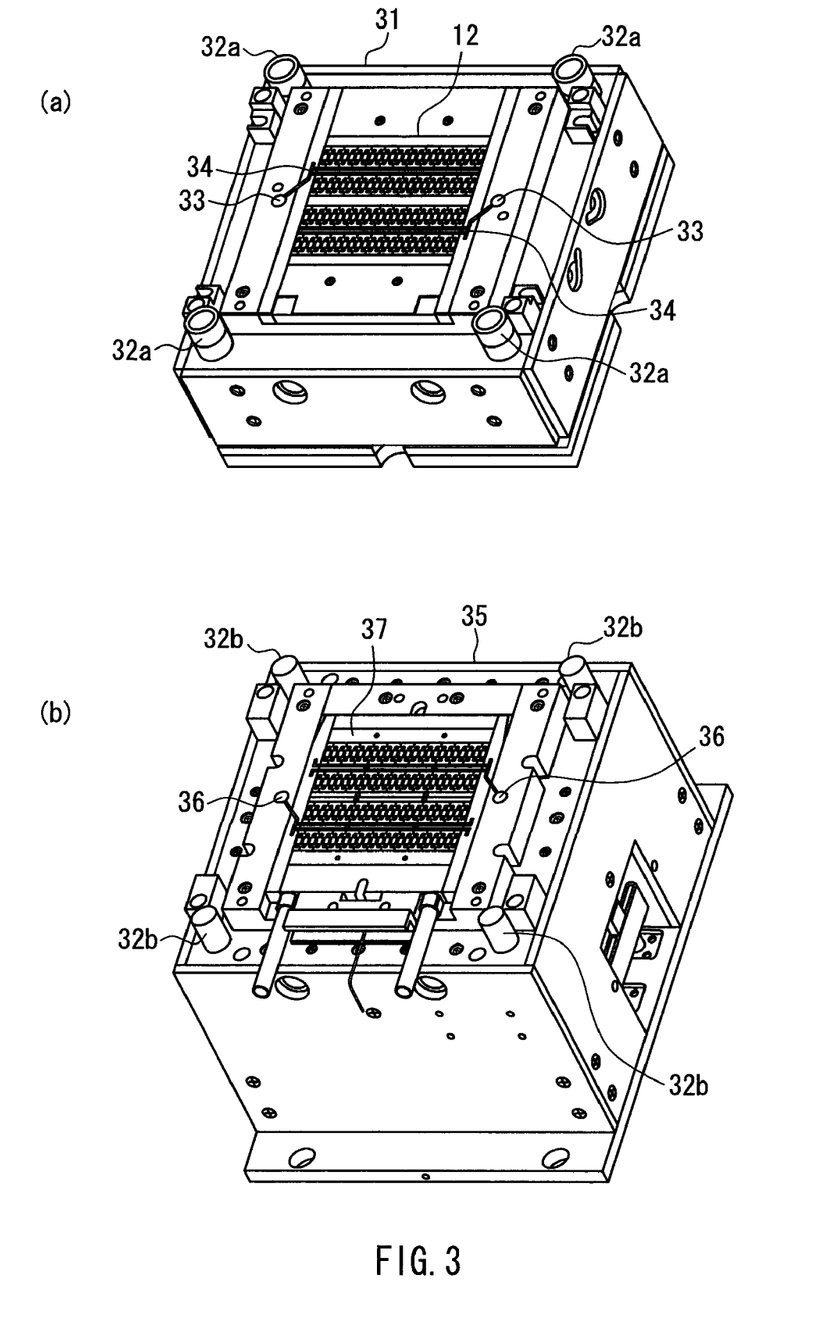
FIG. 3 is a perspective view of upper and lower bases for containing a resin-sealing mold: (a) is a perspective view showing a state in which an upper die base is turned upside down; and (b) is a perspective view of a lower die base.

FIG. 1 is a cross-sectional view of a resin-sealing mold according to Embodiment 1. FIG. 2 is a partially enlarged view of a tip end of a middle die: FIG. 2(a) is a cross-sectional view; and FIG. 2(b) is a perspective view. FIG. 3 is a perspective view of upper and lower bases for containing a resin-sealing mold: FIG. 3(a) is a perspective view showing a state in which an upper die base is turned upside down; and FIG. 3(b) is a perspective view of a lower die base.

The present embodiment is an example in which a resin package similar to the resin package 65 of the light-emitting diode 61 shown in FIG. 7 is molded, and a mold in each of the above-mentioned figures is adapted for this resin package.

As shown in FIG. 1, a resin-sealing mold 11 includes an upper die 12, a middle die 13, and a lower die 14. The middle die 13 is composed of a pair of middle dies 13a and 13b. Furthermore, the lower die 14 is provided with a convex lens forming pin 15 and a guide pin 16.

Although the upper die, the middle die, and the lower die also can be referred to as an upper die cavity block, a middle die cavity block, and a lower die cavity block, they will be referred to simply as an upper die, a middle die, and a lower die in the following description.

In the resin-sealing mold 11, a cavity 18 that is a gap is provided in a portion sandwiched by the upper die 12, the middle die 13, and the lower die 14. By filling the cavity 18 with resin, the resin package 65 for sealing the semiconductor light-emitting element 64 as shown in FIG. 7 can be molded.

In the example shown in FIG. 1, the resin-sealing mold 11 is placed so as to mold the resin package 65 under the condition that the main light extraction direction F (FIG. 7) of the light-emitting diode 61 is directed to the lower die 14 side.

The upper die 12 can move in a vertical direction by action of a lifter (not shown). The middle die 13 can move in a horizontal direction (direction represented by an arrow a) so that the middle dies 13a and 13b move away from each other with respect to dividing faces I. Molding faces are formed at tip ends of the middle dies 13a, 13b, and convex parts 20 are provided on the molding faces. Due to the convex parts 20, the reduced-diameter part 67 constricted from the lens part 68 to the leg part 69 shown in FIG. 7 can be formed, which will be described in detail later.

Next, the convex part 20 provided at the tip end of the middle die 13 will be described in detail with reference to FIGS. 2(a) and (b). As shown in FIG. 2(b), contact faces 20a are formed at the tip ends of the middle dies 13a, 13b. When the middle dies 13a and 13b are brought close to each other so that the molding faces of the middle dies 13a and 13b are opposed to each other, the contact faces 20a are brought into contact with each other. FIG. 2(a) shows the contact state, and the dividing faces I correspond to the contact faces.

Furthermore, the middle dies 13a, 13b are provided with concave curved faces 20d. Consequently, as shown in FIG. 2(a), an opening that spreads gradually downward is formed. This opening corresponds to the curved surface 66 shown in FIG. 7.

Furthermore, the middle dies 13a, 13b are provided with L-shaped faces 20b and curved parts 20c. The L-shaped faces 20b are formed in an L-shape with upper surfaces of the middle dies 13a, 13b in the cross-sectional state of FIG. 2(a), and form a difference in level between the upper surfaces of the middle dies 13a, 13b and the curved parts 20c. The L-shaped faces 20b correspond to the leg part 69 shown in FIG. 7, and the curved parts 20c correspond to an inclined part forming the reduced-diameter part 67.

Thus, due to the presence of the L-shaped faces 20b, the curved parts 20c, and the concave curved faces 20d, the tip ends of the middle dies 13a, 13b are provided with the convex parts 20 corresponding to the concave part of the resin package 65.

In FIG. 1, a through-hole 17 leading to the cavity 18 is formed in the lower die 14, and the convex lens forming pin 15 is inserted in the through-hole 17. The convex lens forming pin 15 is provided with a concave part 19 at a tip end. Although the concave part 19 is illustrated in a simplified manner, the concave part 19 forms three convex lens parts 68a of the lens part 68 shown in FIG. 7.

The guide pin 16 positions a semiconductor light-emitting element frame (described later) and the resin-sealing mold 11. The guide pin 16 is engaged with a hole provided in the semiconductor light-emitting element frame, whereby the resin package 65 can be molded exactly at a position covering the semiconductor light-emitting element 64.

The upper die 12 is placed at the center of the upper die base 31 shown in FIG. 3, and is positioned by being fitted with a positioning frame incorporated in a die set (not shown) in the upper die base 31. Furthermore, the middle die 13 and the lower die 14 are placed at the center of the lower die base 35, and positioned by being fitted with a groove provided in a cavity block frame (not shown) in the lower die base 35.

Furthermore, the upper die 12, the middle die 13, and the lower die 14 are positioned with guide pins (not shown) provided in the positioning frame that is incorporated in the die set in the upper die base 31.

Four cylindrical supports 32a are provided at corners of the upper die base 31. Furthermore, four cylindrical supports 32b are provided at corners of the lower die base 35, which are fitted with the supports 32a when the upper die base 31 is attached to the lower die base 35.

The upper die base 31 and the lower die base 35 respectively are set in the resin-sealing apparatus. The resin-sealing apparatus is provided with a lifter for raising/lowering the upper die base 31. By lowering the upper die base 31 to fit the supports 32a with the supports, the upper die base 31 can be placed on the lower die base 35 with good precision.

A cull part 33 and a resin liner 34 in the upper die base 31 are resin paths provided for the purpose of allowing injected molten resin to flow to the cavity 18. On the other hand, a resin tablet can be input to a cull part 36 in the lower die base 35.

Figure 4:
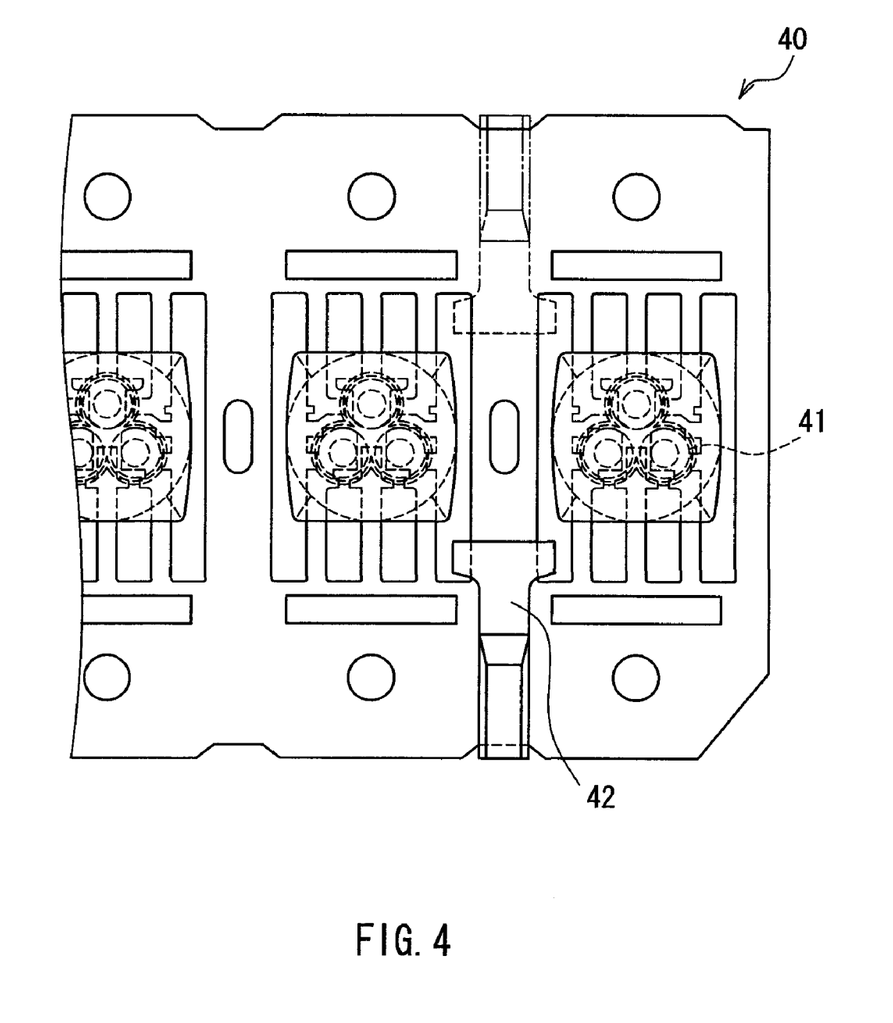
FIG. 4 is an enlarged view of a semiconductor light-emitting element.
Figure 5:
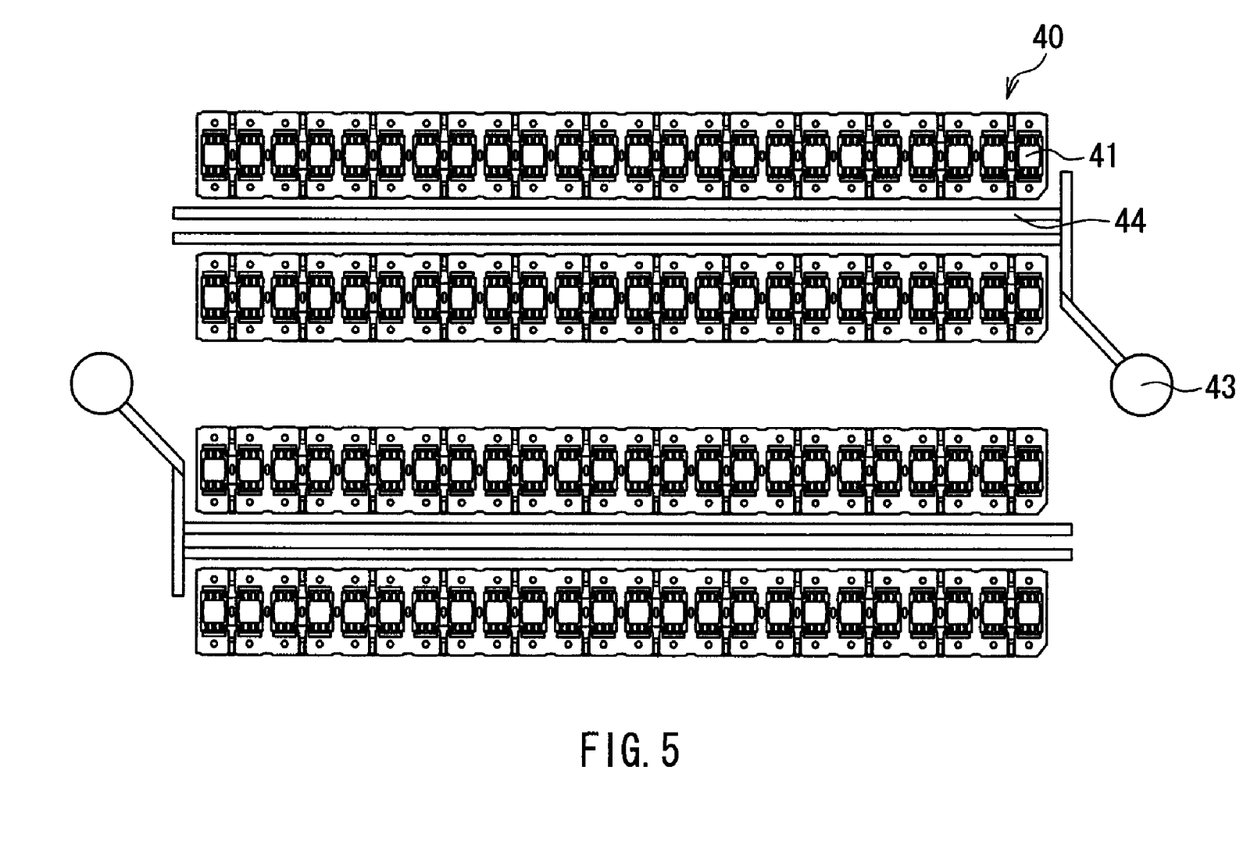
FIG. 5 is a plan view showing a semiconductor light-emitting device taken out after being molded.

Hereinafter, molding steps will be described specifically with reference to FIGS. 1-5. FIG. 4 is an enlarged view of a semiconductor light-emitting element frame (hereinafter, referred to as a "frame"). FIG. 5 is a plan view showing a semiconductor light-emitting device taken out after being molded.

First, the middle die 13 is fitted with the lower die 14. This will be referred to as a lower middle die 37. The lower middle die 37 is preheated with a hot plate for a mold (not shown) before the lower middle die 37 is set in the lower die base 35. After sufficient preheating, the frame 40 is set in the middle die 13 with a board part 41 facing downward to the lower die 14 side.

Next, as shown in FIG. 3(a), the upper die 12 is set in the upper die base 31, and as shown in FIG. 3(b), the lower middle die 37 is set in the lower die base 35. After that, the upper die base 31 and the lower die base 35 respectively are set in the resin-sealing apparatus. After a resin tablet is input to the cull part 36, the upper die base 31 is placed on the lower die base 35 so that the supports 32a and 32b are fitted with each other, whereby both bases are clamped.

When clamping is completed, the resin tablet input to the cull part 36 of the lower die base 35 is melted. The molten resin is injected from the cull part 36 by a plunger (not shown) in the cull part 36. Then, the injected molten resin spreads from the cull part 33 of the upper die base 31 to the frame 40 through the resin liner 34.

As shown in FIG. 4, the molten resin having passed through the resin liner 34 flows in the board part 41 through a gate liner 42. The flowed molten resin fills the cavity 18. After the resin is cured, the upper die base 31 is raised by the resin-sealing apparatus, and the mold is opened between the upper die 12 and the lower middle die 37. After that, the lower middle die 37 is lifted up by an eject push-up operation of a press mechanism to be removed from the lower die base 35.

After the lower middle die 37 is taken out, the liner is separated first. After that, the lower die 14 and the middle die 13 are separated. Consequently, the lower die 14 and the upper die 13 are removed from the middle die 13. In this state, when the middle dies 13a and 13b are moved in a horizontal direction so as to move away from each other, the dividing faces I are opened to the right and left, whereby the semiconductor light-emitting element frame 40 after the resin package part shown in FIG. 5 is molded can be taken out.

According to such mold release, even when the reduced-diameter part 67 that is a concave part is formed in a side surface of the light-emitting diode 61, the middle dies 13a, 13b can be opened easily.

The frame 40 after the resin package part 65 is molded is taken out in a state in which a cull part residual resin 43 and a resin liner residual resin 44, which are formed of cured excess resin, adhere to the frame 40, as shown in FIG. 5. These resins are removed from the frame 40 easily, so that they are removed by being respectively separated. Furthermore, by separating the frame 40 into pieces, a semiconductor light-emitting device is obtained.

After the above-mentioned steps are completed, burrs adhering to the lower die 14 and the middle die 13 are cleaned by air blow, for subsequent production.

Embodiment 2

Figure 6:
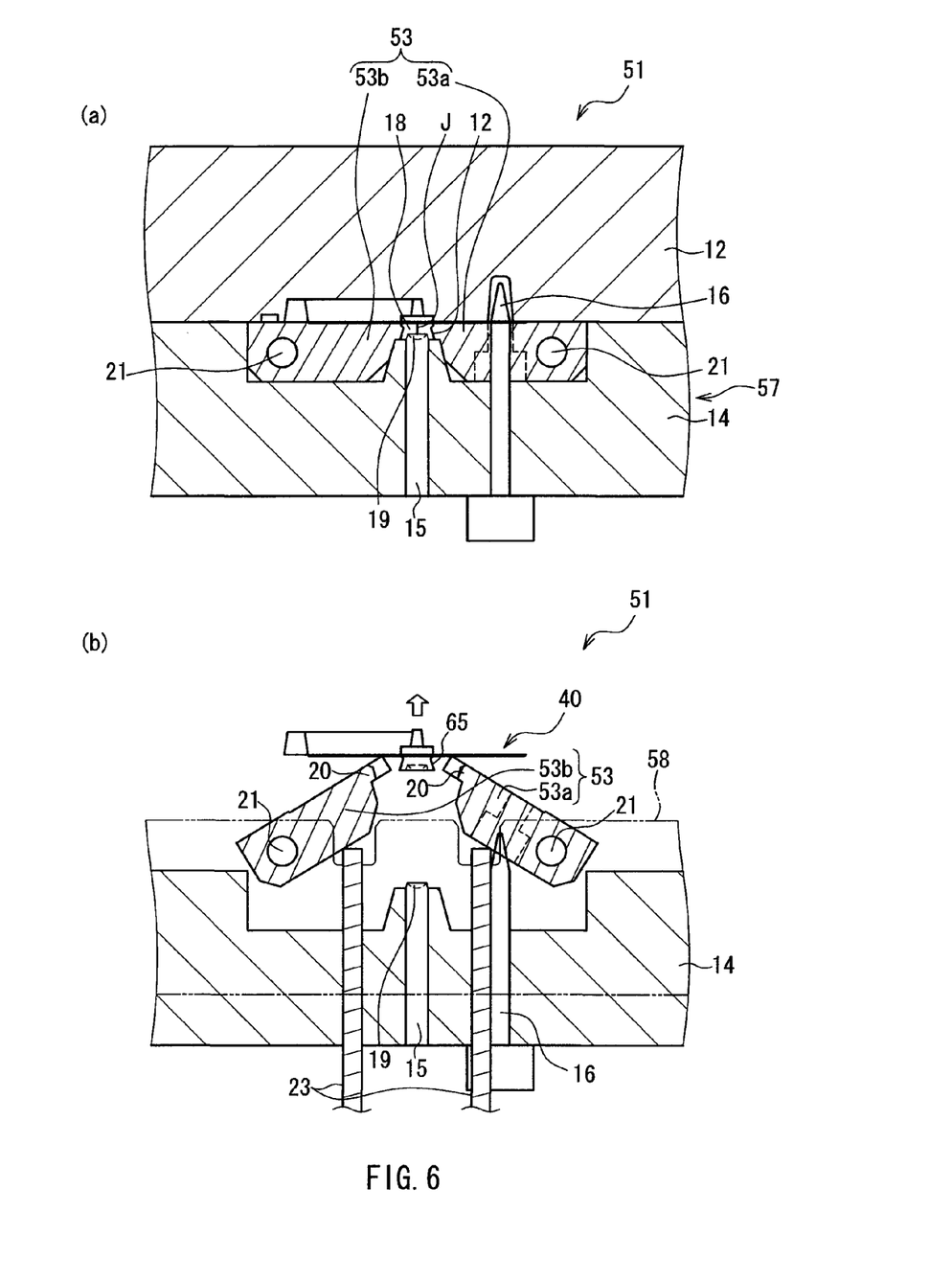
FIG. 6 is a cross-sectional view showing a configuration of a resin-sealing mold with resin sealed according to Embodiment 2 of the present invention: (a) is a cross-sectional view showing a state during clamping; and (b) is a cross-sectional view showing a state when a mold is opened.

FIG. 6 is a cross-sectional view showing a resin-sealing mold according to Embodiment 2. FIG. 6(a) is a cross-sectional view showing a state during clamping, and FIG. 6(b) is a cross-sectional view showing a state when the mold is opened. The same components as those in Embodiment 1 are denoted with the same reference numerals as those therein, and the detailed description thereof will be omitted.

The middle die according to Embodiment 2 is similar to that of Embodiment 1 in a basic configuration of the molding face (convex part) at a tip end; however, it is different from the configuration of Embodiment 1 in that a rotation shaft acting as a fulcrum is provided in a base end so that the molding face moves in an arc shape.

As shown in FIG. 6(a), a resin-sealing mold 51 includes an upper die 12, a middle die 53, and a lower die 14. The middle die 53 is composed of a pair of middle dies 53a and 53b. The lower die 14 is provided with a convex lens forming pin 15 and a guide pin 16.

In the resin sealing mold 51, a cavity 18 that is a gap is provided in a portion sandwiched by the upper die 12, the middle die 53, and the lower die 14. By fling the cavity 18 with resin, the resin package 65 as shown in FIG. 7 can be molded.

In the example shown in FIG. 6, in the same way as in the example shown in FIG. 1, the resin-sealing mold 51 is placed so as to mold the resin package 65 with the main light extraction direction F (FIG. 7) of the light-emitting diode 61 directed to the lower die 14 side.

A convex part 20 provided at the tip end of the middle die 53 has the same shape as that shown in FIG. 2 in Embodiment 1. The base end of the middle die 53 is provided with a rotation shaft 21 for moving the tip end in an arc shape. The rotation shaft 21 functions as a fulcrum when the mold is opened while the molding faces of the tip ends of the middle dies 53a, 53b rotate in an arc shape.

As shown in FIG. 6(b), the resin-sealing apparatus 51 is provided with ejector pins 23 for pushing up the middle dies 53a, 53b to rotate the tip ends in an arc shape. The ejector pins 23 are placed on the tip end side of the middle dies 53a, 53b relative to the rotation shafts 21, and are inserted in through-holes of the lower die 14.

According to this configuration, two ejector pins 23 push the middle dies 53a, 53b to move them by a lifter (not shown) provided in the resin-sealing apparatus 51, whereby the mold can be opened while the tip ends of the middle dies 53a, 53b rotate in an arc shape with respect to the rotation shafts 21.

Hereinafter, the mold release of a molded product will be described with reference to FIGS. 3-6. The steps up to that of curing resin are similar to those in Embodiment 1 of the present invention, so the description thereof will be omitted. Furthermore, the middle die 53 fitted with the lower die 14 will be referred to as a lower middle die 57.

After the resin is cured, the upper die base 31 is raised by the resin-sealing apparatus, whereby the mold is opened between the upper die 12 and the lower middle die 57. Since the upper die 12 is away from the lower middle die 57 due to this mold opening, there is a space in which the middle dies 53a, 53b can move upward. In this state, the middle dies 53a, 53b are moved so as to float upward while maintaining a horizontal state. The rotation shafts 21 of the middle dies 53a, 53b are attached to a base part 58 provided outside of the lower die 14, so that the base part 58 is lifted up by the lifter (not shown), whereby the above-mentioned floating can be performed.

After that, as shown in FIG. 6(b), the ejector pins 23 are moved so as to push the middle dies 53a, 53b with the lifter of the resin-sealing apparatus. Due to this movement, the middle dies 53a, 53b are opened in a truncated chevron shape with the rotation shafts 21 being fulcrums, and dividing faces J (FIG. 6(a)) that are in contact move away from each other. Along with the rotation operation of the middle dies 53a, 53b, the resin package 65 is released from the convex parts 20, while the frame 40 is being lifted up gradually. FIG. 6(b)

shows a state in which the mold release has been completed, and in this state, the frame 40 can be taken out easily.

The frame 40 of the resin package part 65 is taken out in a state in which a cull part residual resin 43 and a resin liner residual resin 44, which are formed of cured excess resin, adhere to the frame 40, as shown in FIG. 5. These resins can be removed from the frame 40 easily, so that they are removed by being separated respectively. The semiconductor light-emitting element frame 40 is separated into pieces, whereby a semiconductor light-emitting device is obtained.

After the above-mentioned steps are completed, the middle dies 53a, 53b are inverted, and parting faces in contact with the lower die 14 are cleaned by air blowing. After that, the middle dies 53a, 53b are returned to an original state, and the surface side is cleaned by air blowing for subsequent production.

In Embodiments 1 and 2, the resin-sealing mold formed of two middle dies has been described. However, the present invention is not limited thereto, and a resin package of a semiconductor device may be molded using three or more middle dies.

Furthermore, it has been exemplified that the resin-sealing mold and the resin-sealing apparatus of Embodiments 1 and 2 mold the resin package 65 for the light-emitting diode 61 shown in FIG. 7. However, any resin package may be used as long as it has a concave part in a side surface, and the present invention is applicable to the molding of a resin package of various kinds of semiconductor devices.

Furthermore, the resin package having a concave part in a side surface has been exemplified. However, the present invention is not limited thereto, and for example, the present invention also is applicable to the molding of a resin package having a projection in a side surface. In this case, a concave part corresponding to the projection is provided on the molding face of the middle die.

Furthermore, in the resin-sealing mold and the resin-sealing apparatus of Embodiments 1, 2, the molding of a resin package of a semiconductor device by a transfer molding method has been described. However, the present invention is not limited thereto, and the present invention also can be used for another molding method such as an injection molding method.

INDUSTRIAL APPLICABILITY

As described above, the present invention is useful as a resin-sealing mold and a resin-sealing apparatus for molding a resin package of a semiconductor device, in particular, a resin package with a concave part formed in a side surface.

The invention claimed is:

1. A resin-sealing mold for sealing a semiconductor element with resin, comprising:
    an upper die; a lower die disposed so as to be opposed to the upper die; and a plurality of middle dies sandwiched between the upper die and the lower die,
    wherein the plurality of middle dies are provided with molding faces at tip ends and are placed so that the molding faces are opposed to each other during the sealing,
    at least one of the molding faces is provided with a convex part forming a concave part in a side surface of the resin after being molded,
    the plurality of middle dies respectively have rotation shafts so that the molding faces rotate in an arc shape, and
    the rotation shafts are attached to a base part, and the base part enables the middle dies to move so as to float upward from the lower die.

* * * * *